(12) United States Patent
Ku et al.

(10) Patent No.: US 12,164,221 B2
(45) Date of Patent: *Dec. 10, 2024

(54) EXTREME ULTRAVIOLET LIGHT REFLECTIVE STRUCTURE INCLUDING NANO-LATTICE AND MANUFACTURING METHOD THEREOF

(71) Applicant: TAIWAN SEMICONDUCTOR MAUFACTURING COMPANY, LTD., Hsinchu (TW)

(72) Inventors: Benny Ku, Bielefeld (DE); Keith Kuang-Kuo Koai, Hsinchu (TW); Wen-Hao Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/227,866

(22) Filed: Jul. 28, 2023

(65) Prior Publication Data

US 2023/0375909 A1    Nov. 23, 2023

Related U.S. Application Data

(60) Continuation of application No. 17/875,385, filed on Jul. 27, 2022, now Pat. No. 11,762,280, which is a division of application No. 16/591,181, filed on Oct. 2, 2019, now Pat. No. 11,454,877.

(60) Provisional application No. 62/753,913, filed on Oct. 31, 2018.

(51) Int. Cl.
*G03F 1/24* (2012.01)

(52) U.S. Cl.
CPC .................................... *G03F 1/24* (2013.01)

(58) Field of Classification Search
CPC ........................................................ G03F 1/24
USPC ............................................................ 430/5
See application file for complete search history.

(56) References Cited

U.S. PATENT DOCUMENTS

| | | | |
|---|---|---|---|
| 11,086,209 B2 | 8/2021 | Shih et al. | |
| 11,454,877 B2* | 9/2022 | Ku | G03F 7/70958 |
| 2015/0212427 A1 | 7/2015 | Li et al. | |
| 2018/0233521 A1 | 8/2018 | Na et al. | |

FOREIGN PATENT DOCUMENTS

| | | |
|---|---|---|
| CN | 102692812 A | 9/2012 |
| CN | 102798902 A | 11/2012 |
| CN | 103430283 A | 12/2013 |
| CN | 103748660 A | 4/2014 |
| CN | 108693696 A | 10/2018 |
| TW | 514267 U | 12/2002 |
| TW | 1620977 B | 4/2018 |

OTHER PUBLICATIONS

Yen-Min Lee et al., "Void-based photonic crystal mirror with high reflectivity and low dissipation for extreme-ultraviolet radation," J. of Micro/Nanolithography, MEMS, and MOEMS, vol. 12, Issue 4, p. 043005 (Dec. 6, 2013).

Notice of Allowance issued in U.S. Appl. No. 17/875,385, dated May 18, 2023.

* cited by examiner

*Primary Examiner* — Christopher G Young

(74) *Attorney, Agent, or Firm* — STUDEBAKER & BRACKETT PC

(57) ABSTRACT

An EUV reflective structure includes a substrate and multiple pairs of a Si layer and a Mo layer. The Si layer includes a plurality of cavities.

20 Claims, 17 Drawing Sheets

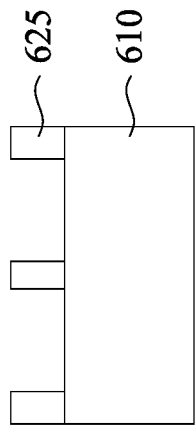
FIG. 11
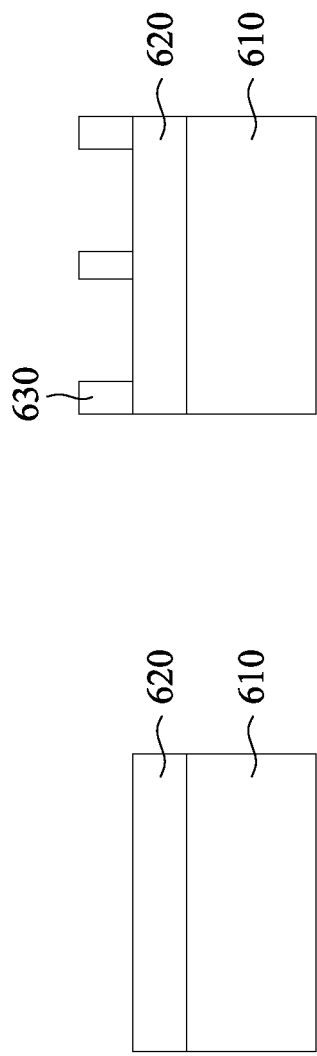
FIG. 12
FIG. 13
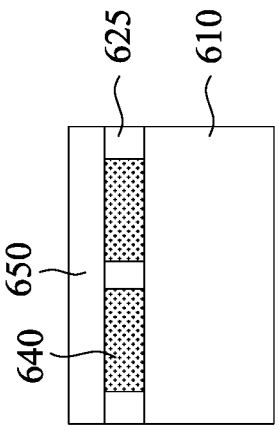
FIG. 14
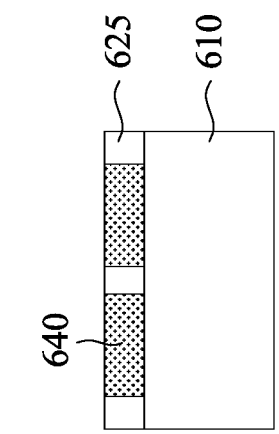
FIG. 15
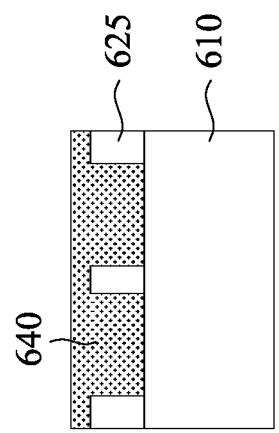
FIG. 16

EXTREME ULTRAVIOLET LIGHT REFLECTIVE STRUCTURE INCLUDING NANO-LATTICE AND MANUFACTURING METHOD THEREOF

RELATED APPLICATIONS

This application is a continuation of U.S. patent application Ser. No. 17/875,385 filed Jul. 27, 2022, which is a divisional of U.S. patent application Ser. No. 16/591,181 filed Oct. 2, 2019, now U.S. Pat. No. 11,454,877, which claims priority to U.S. Provisional Patent Application No. 62/753,913 filed Oct. 31, 2018, the entire contents of each of which is incorporated herein by reference.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm, e.g., 13.5 nm. Since a projection lens type exposure apparatus cannot be used in an EUV lithography, all reflective optical system is required in the EUV lithography. Accordingly, an EUV reflective structure (reflector, such as a mirror) having a high reflectance is one of the key technology in the EUV lithography.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11 shows a view of one of the various stages of a sequential manufacturing operation for an EUV reflective structure according to an embodiment of the present disclosure.

FIG. 12 shows a view of one of the various stages of a sequential manufacturing operation for an EUV reflective structure according to an embodiment of the present disclosure.

FIG. 13 shows a view of one of the various stages of a sequential manufacturing operation for an EUV reflective structure according to an embodiment of the present disclosure.

FIG. 14 shows a view of one of the various stages of a sequential manufacturing operation for an EUV reflective structure according to an embodiment of the present disclosure.

FIG. 15 shows a view of one of the various stages of a sequential manufacturing operation for an EUV reflective structure according to an embodiment of the present disclosure.

FIG. 16 shows a view of one of the various stages of a sequential manufacturing operation for an EUV reflective structure according to an embodiment of the present disclosure.

DETAILED DESCRIPTION

Figure 1:
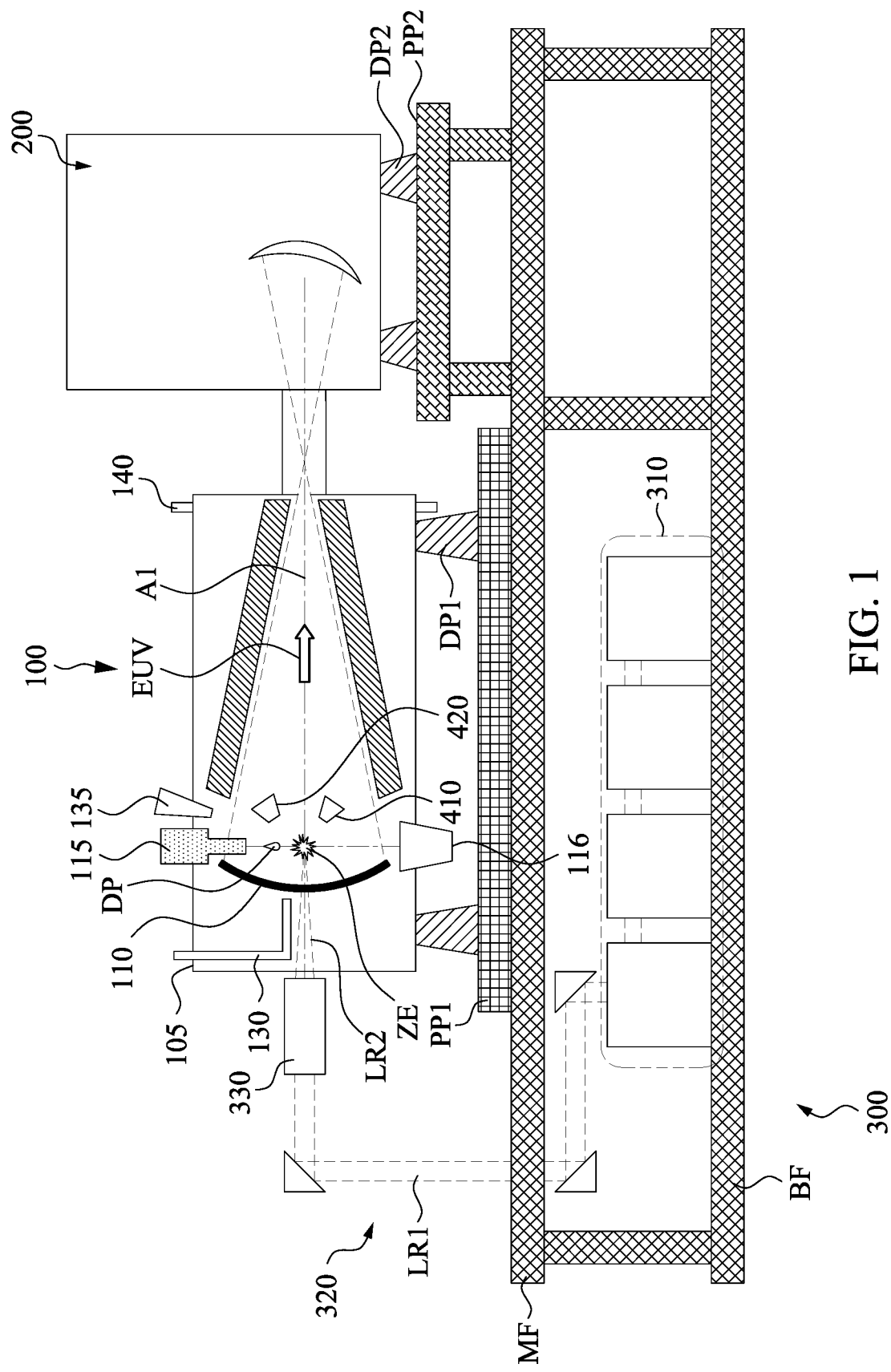
FIG. 1 is a schematic view of an EUV lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to an extreme ultraviolet (EUV) reflector, such as a EUV reflective mirror and a EUV photo mask. In the following embodiments, materials, configuration, dimensions, processes and/or method explained with respect to one embodiments can be applied to other embodiments, and the detailed description thereof may be omitted.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 2:
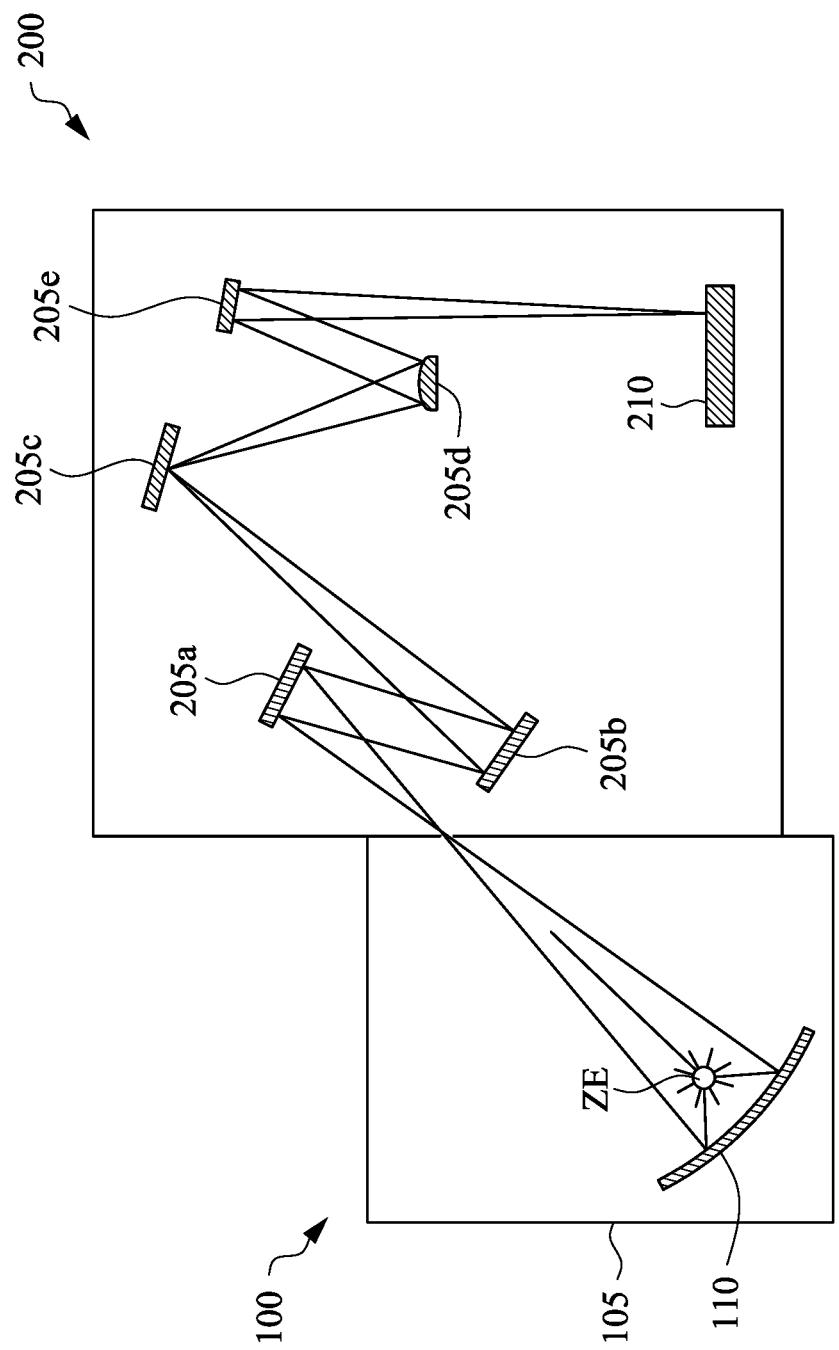
FIG. 2 shows a schematic diagram of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including plasma at ZE emitting EUV light in a chamber 105 that is collected and reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes. The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50-50000 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target in a pancake shape, which is subsequently heated (or reheated) by the main laser pulse, generating increased emission of EUV light. In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target in a pancake shape. A delay between the pre-pulse and the main pulse is controlled to allow the target in a pancake shape to form and to expand to an optimal size and geometry. When the main pulse heats the target in a pancake shape, a high-temperature plasma is generated. The plasma emits EUV radiation EUV, which is collected by the collector mirror 110. The collector 110 has a reflection surface that reflects and focuses the EUV radiation for the lithography exposing processes. In some embodiments, a droplet catcher 116 is installed opposite the target droplet generator 115. The droplet catcher 116 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105. Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200. To trap the $SnH_4$ or other debris, one or more debris collection mechanisms or devices 150 are employed in the chamber 105.

As shown in FIG. 2, the EUV lithography system requires various EUV reflective structures, such as flat and curved mirrors. Many of the EUV reflective structures include multiple reflective layers (ML) deposited on a substrate, as an EUV reflective structure. The ML includes a plurality of film pairs, such as molybdenum-silicon (Mo/Si) film pairs (e.g., a layer of molybdenum above or below a layer of silicon in each film pair). In the present disclosure, nano cavities 25 are periodically arranged in the Si layer of the ML system to increase EUV reflectivity.

Multilayers are complicated systems and substantially impossible to describe analytically. In general, one can solve the Maxwell equation numerically with certain boundary conditions, since they are physically the fundamental of electro-magnetic waves (light) and mathematically a set of partial differential equations:

$$\vec{\nabla} \cdot \vec{D} = 0, \vec{\nabla} \times \vec{E} = \frac{\partial \vec{B}}{\partial t}, \vec{\nabla} \cdot \vec{B} = 0, \vec{\nabla} \times \vec{H} = \frac{\partial \vec{D}}{\partial t} + \vec{J}$$

Only simple layer problems can be completely understood analytically.

Transmitted light travels longer distance due to refraction. This cause a phase difference when the transmitted light reflects back to the top, which can lead to interference effects. This can be used to make anti-reflection coatings.

The incident EUV light becomes a standing-wave when entering the Mo/Si multilayer. Mo has a greater absorption coefficient than Si:

$$\beta_{Mo} > \beta_{Si}, \Delta\beta = \beta_{Mo} - \beta_{Si},$$

thus it is used for the low-intensity standing-wave field. Placing nano cavities into the Si-layer causes a decrease in the absorption coefficient, which enhances resonance and therefore the total reflected intensity (maximize $\Delta\beta$).

Figure 3A:
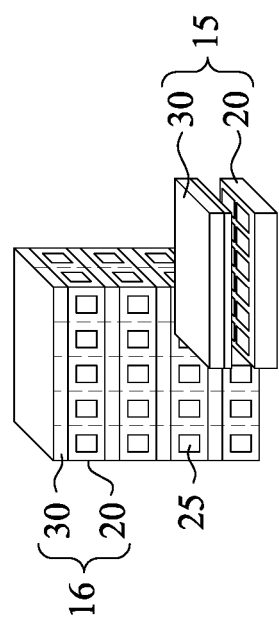
FIG. 3A is a perspective view of an EUV reflective structure according to an embodiment of the present disclosure.
Figure 3B:
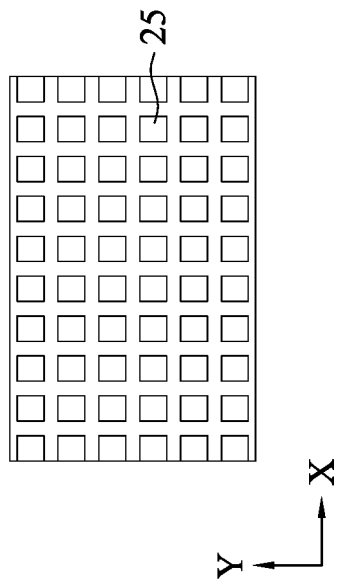
FIG. 3B is a plan view of cavities when horizontally cutting the Si layer.
Figure 3C:
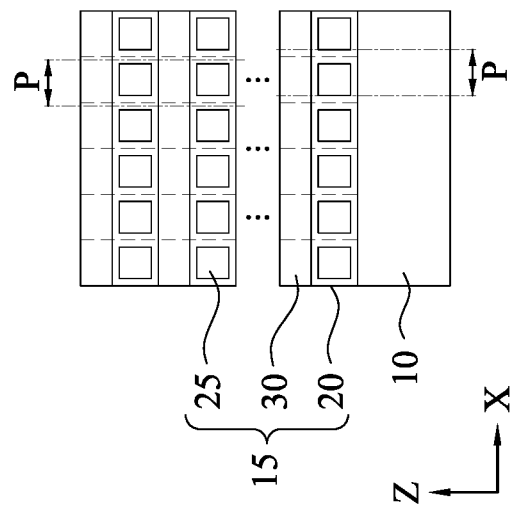
FIG. 3C is a cross sectional view and FIG. 3D is an enlarged perspective view of a unit structure of the EUV reflective structure shown in FIG. 3A.
Figure 3D:
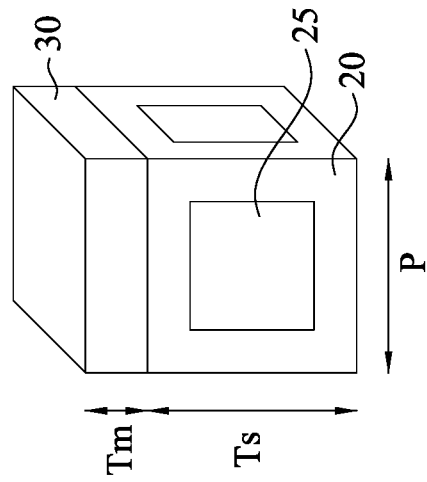

FIG. 3A is a perspective view of an EUV reflective structure according to an embodiment of the present disclosure. FIG. 3B is a plan view of the cavities when horizontally cutting the Si layer, FIG. 3C is a cross sectional view and FIG. 3D is an enlarged perspective view of a unit structure of the EUV reflective structure shown in FIG. 3A.

As shown in FIGS. 3A-3D, the EUV reflective structure includes first layers 20 and second layers 30 alternately stacked. In some embodiments, the first layers 20 are made of Si and the second layers 30 are made of Mo.

In some embodiments, nano cavities 25 are arranged in each Si layer 20 of the whole Mo/Si-multilayer system 15. In some embodiments, the nano-cavities 25 have a cubic shape, a polygonal pillar shape and/or a cylindrical shape. In certain embodiments, the nano cavities 25 are periodically arranged in the Si layer 20. In some embodiments, the nano cavities 25 are periodically arranged within one Si layer (in the X-Y plane). In other embodiments, the nano cavities 25 are periodically arranged in the all directions. In other embodiments, at least one of the Si layers 20 includes the nano cavities 25, and at least one of the Si layers 20 includes no nano cavities 25.

In some embodiments, the nano cavities 25 are filled with a gas, such as air or inert gas (Ar, He, Ne and/or $N_2$, etc). In some embodiments, the gas pressure is atmospheric. In other embodiments, the nano cavities 25 are maintained at a pressure lower than 1 Pa (vacuum). In certain embodiments, the nano cavities 25 are filled with a dielectric material, such as silicon oxide.

As shown in FIGS. 3A-3D, the nano cavities 25 are fully embedded (sealed) in the Si layer in some embodiments. In other words, each of the nano cavities 25 is fully surrounded by a Si body of the Si layer 20.

In some embodiments, each of the plurality of cavities has an area in plan view (in X-Y plane) in a range from about 1 $nm^2$ to 10000 $nm^2$. In other embodiments, the area in plan view of the cavity is in a range from about 10 $nm^2$ to 1000 $nm^2$. In some embodiments, a volume of each of the plurality of cavities is in a range from about 1 $nm^3$ to 1,000,000 $nm^3$. In other embodiments, the volume of the cavity is in a range from about 30 $nm^3$ to 30,000 $nm^3$.

Figure 4B:
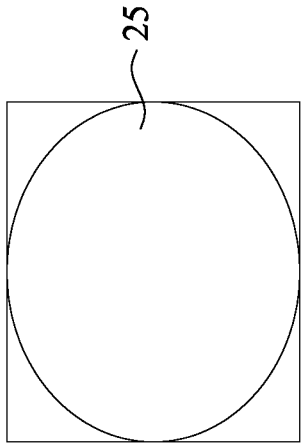
FIG. 4A is a side view of a cavity and FIG. 4B is a plan view of the cavity according to an embodiment of the disclosure.
Figure 4D:
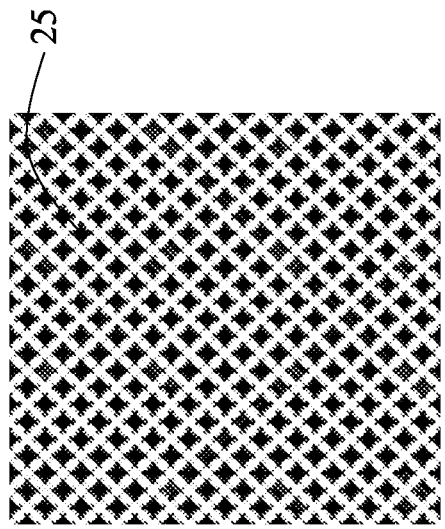
FIG. 4D is a plan view of the cavities according to another embodiment of the disclosure.
Figure 4A:
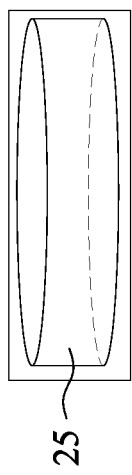
Figure 4C:
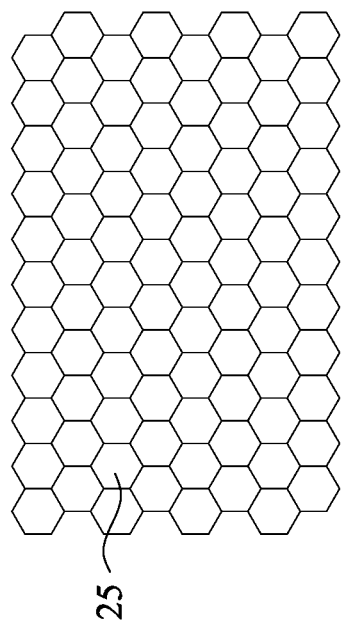
FIG. 4C is a plan view of the cavities according to another embodiment of the disclosure.

In some embodiments, each of the nano cavities 25 has a polygonal (e.g., hexagonal) pillar shape. In certain embodiments, each of the nano cavities 25 has a cubic shape. In other embodiments, each of the plurality of cavities has a cylindrical pillar shape as shown in FIGS. 4A and 4B. In some embodiments, the nano cavities 25 are arranged in a simple matrix as shown in FIG. 3B. In some embodiments, as shown in FIG. 4C, the nano cavities 25 have a honeycomb arrangement (hexagonal bottom/top shape). In other embodiments, as shown in FIG. 4D, the nano cavities 25 are arranged in a diagonal-orthogonal arrangement. These arrangements can increase thermal stability and prevent cracking.

As shown in FIGS. 3B, 3C and 3D, the nano cavities 25 are arranged in a matrix in the Si layer 20 with a constant pitch P. In some embodiments, the pitch in the X direction is equal to the pitch in the Y direction. In some embodiments, the pitch P is in a range from about 5 nm to about 50 nm and is in a range from about 10 nm to about 25 nm in other embodiments.

In other embodiments, the pitches in the X and Y directions are different from each other. In some embodiments, a thickness of each Si/Mo pair 16 is in a range from 6 nm to 8 nm, and is in a range from 6.5 nm to 7.5 nm in other embodiments. In some embodiments, a thickness Ts of the Si layer 20 and a thickness Tm of the Mo layer 30 satisfy Ts:Tm=5:5 to 7:3. In some embodiments, the total number of the Si/Mo pairs 16 is at least 40. In some embodiments, the total number of the Si/Mo pairs 16 is less than 100. In some embodiments, the thickness of the Si layer under the cavities is equal to the thickness of the Si layer above the cavities. In other embodiments, the thickness of the Si layer under the cavities is different from the thickness of the Si layer above the cavities.

In some embodiments, no cavity is disposed in the Mo layer. In some embodiments, the Mo layer 30 is disposed on the Si layer 20. In other words, the Si layer 20 is in contact with a substrate 10 and the Mo layer 30 is the uppermost layer of the multilayer structure 15. The substrate 10 is a suitable material, such as a low thermal expansion material or fused quartz. In various examples, the material of the substrate 10 includes $TiO_2$ doped $SiO^2$, or other suitable materials with low thermal expansion. In some embodiments, one or more layers are inserted between the substrate 10 and the lowest Si layer 20.

In some embodiments, the Si/Mo multilayer structure 15 can be fabricated by one or more film deposition, lithography and etching operations. In some embodiments, a Si layer is formed over the underlying layer, e.g., substrate 10 by using chemical vapor deposition (CVD), physical vapor deposition (PVD) including sputtering, atomic layer deposition (ALD) or any other suitable film formation techniques. Then, by using one or more lithography and etching operations, holes are formed in the Si layer. Next, another Si layer is formed to cover the holes, thereby forming nano cavities. In some embodiments, before another Si layer is formed, the nano cavities are filled with dielectric material or a gas. Then, a Mo layer is formed by CVD, PVD, ALD, or any other suitable film formation techniques. In some embodiments, a thin Si layer is separately formed, and transferred over the Si layer with the holes. In certain embodiments, a bilayer of Si and Mo is separately formed, and transferred over the Si layer with the holes.

Figure 5B:
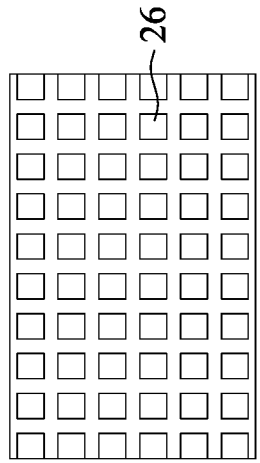
FIG. 5B is a plan view of the cavities.
Figure 5D:
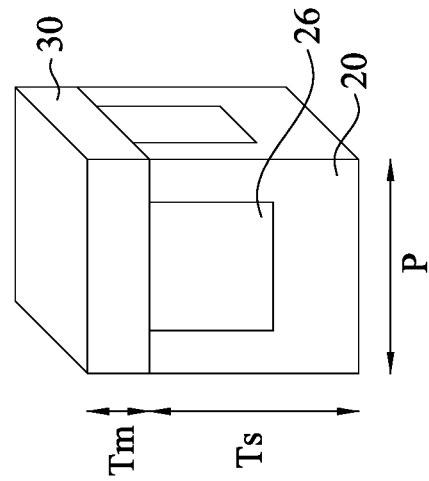
FIG. 5C is a cross sectional view and FIG. 5D is an enlarged perspective view of a unit structure of the EUV reflective structure shown in FIG. 5A.
Figure 5A:
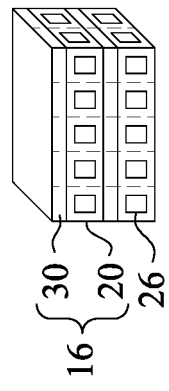
FIG. 5A is a perspective view of an EUV reflective structure according to an embodiment of the present disclosure.
Figure 5C:
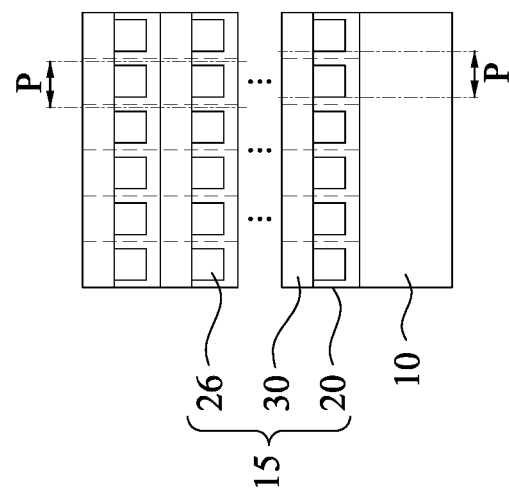

FIG. 5A is a perspective view of an EUV reflective structure according to another embodiment of the present disclosure. FIG. 5B is a plan view of the nano cavities 25, FIG. 5C is a cross sectional view and FIG. 5D is an enlarged perspective view of a unit structure of the EUV reflective structure shown in FIG. 5A. Material, configurations, dimensions, processes and/or methods as described with respect to the above embodiments may be employed in the following embodiments, and detailed explanation thereof may be omitted.

In the embodiment of FIGS. 5A-5D, the top face of each of the nano cavities 25 is covered by the Mo layer 30. Thus, the nano cavities 26 are sealed by the body of the Si layer 20 at the bottom and sides and by the Mo layer 30 at the top.

In some embodiments, the Si/Mo multilayer structure 15 shown in FIGS. 5A-5D can be fabricated by one or more film deposition, lithography and etching operations. In some embodiments, a Si layer is formed over the underlying layer, e.g., substrate 10 by using CVD, PVD, ALD or any other suitable film formation techniques. Then, by using one or more lithography and etching operations, holes are formed in the Si layer. Next, a Mo layer is formed by CVD, PVD, ALD, or any other suitable film formation techniques. In some embodiments, before the Mo layer is formed, the nano cavities are filled with dielectric material or a gas. In some embodiments, a Mo layer is separately formed, and transferred over the Si layer with the holes.

Figure 6A:
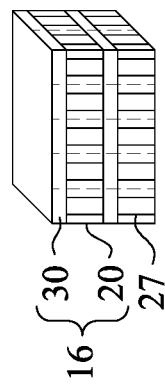
FIG. 6A is a perspective view of an EUV reflective structure according to an embodiment of the present disclosure.
Figure 6B:
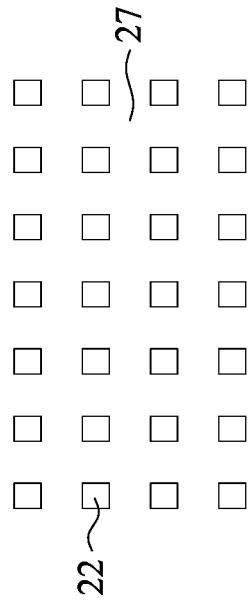
FIG. 6B is a plan view of cavities.
Figure 6C:
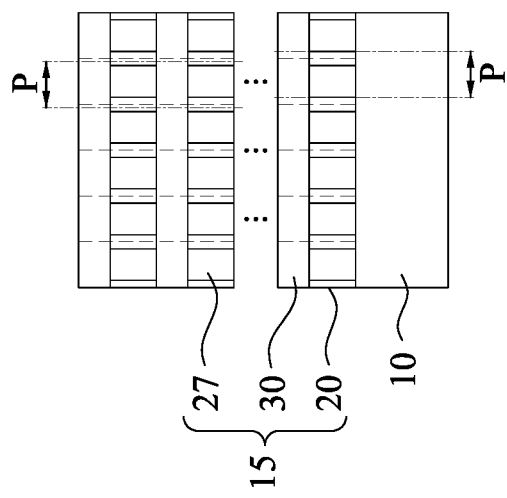
FIG. 6C is a cross sectional view and FIG. 6D is an enlarged perspective view of a unit structure of the EUV reflective structure shown in FIG. 6A.
Figure 6D:
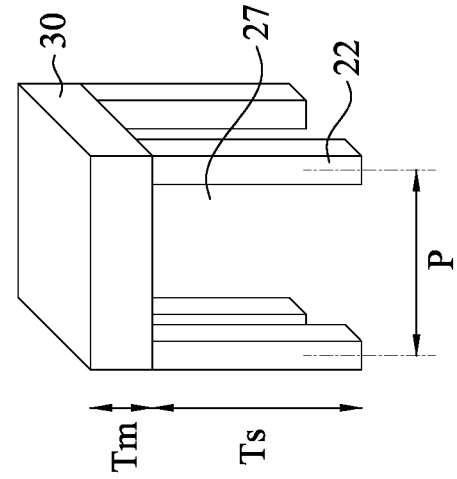

FIG. 6A is a perspective view of an EUV reflective structure according to an embodiment of the present disclosure. FIG. 6B is a plan view of the nano cavities 25, FIG. 6C is a cross sectional view and FIG. 6D is an enlarged perspective view of a unit structure of the EUV reflective structure shown in FIG. 6A. Material, configurations, dimensions, processes and/or methods as described with respect to the above embodiments may be employed in the following embodiments, and detailed explanation thereof may be omitted.

In this embodiment, the Si layers 20 are constituted by a plurality of Si pillars 22. The nano cavities 27 are areas among the pillars 22, and sealed by the Mo layers at the top and the bottom. The width of each of the Si pillars is in a range from about 3 nm to about 25 nm in some embodiments, and is in a range from about 5 nm to about 15 nm in other embodiments.

In some embodiments, the Si/Mo multilayer structure 15 shown in FIGS. 6A-6D can be fabricated by one or more film deposition, lithography and etching operations. In some embodiments, a Si layer is formed over the underlying layer, e.g., substrate 10 by using CVD, PVD, ALD or any other suitable film formation techniques. Then, by using one or more lithography and etching operations, the Si pillars are formed. Next, a Mo layer is formed by CVD, PVD, ALD, or any other suitable film formation techniques. In some embodiments, a Mo layer is separately formed, and transferred over the Si pillars.

In some embodiments, after the Si pillars are formed, dielectric material, such as silicon oxide or silicon nitride, is formed to fill spaces between the Si pillars. Then, a planarization operation, such as chemical mechanical polishing (CMP), is performed to expose the top faces of the Si pillars. Subsequently, a Mo layer is formed. In some embodiments, after the Mo layer is formed, the dielectric material is removed by using a wet etching technique.

Figure 6F:
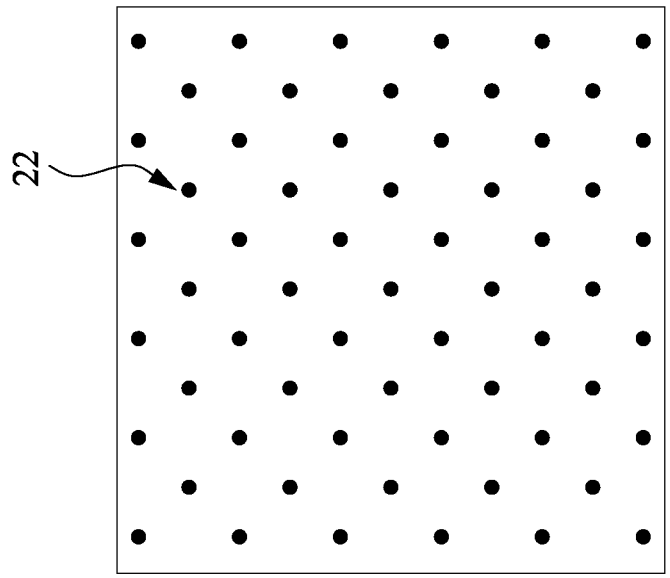
FIG. 6F shows an arrangement of Si pillars according to another embodiment of the disclosure.
Figure 6E:
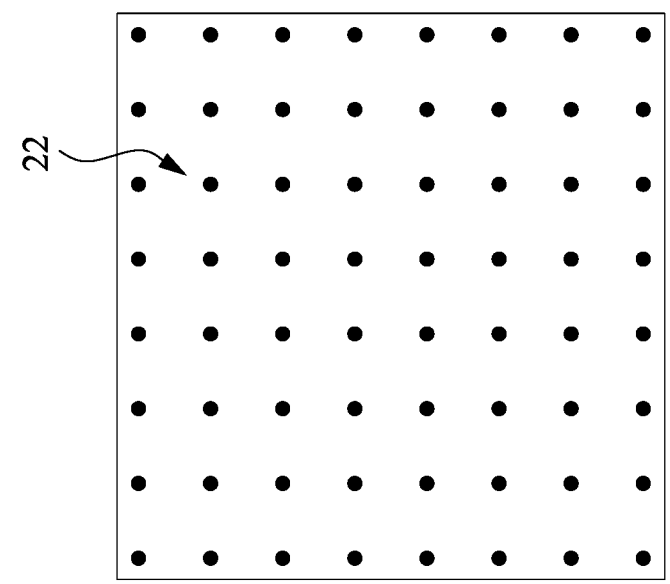
FIG. 6E shows an arrangement of Si pillars according to an embodiment of the disclosure.

FIG. 6E shows an arrangement of the Si pillars 22 according to an embodiment of the disclosure. In FIG. 6E, the Si pillars 22 are arranged in a simple matrix. FIG. 6F shows another arrangement of Si the pillars 22 according to another embodiment of the disclosure. In FIG. 6F, the Si pillars 22 are arranged in a hexagonal matrix.

Figure 7A:
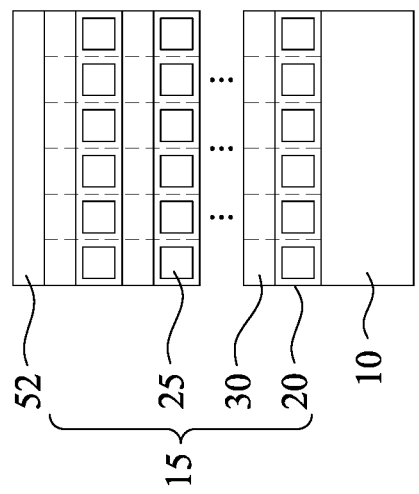
FIGS. 7A, 7B and 7C show various cross sectional views of EUV reflective structures according to embodiments of the disclosure.
Figure 7B:
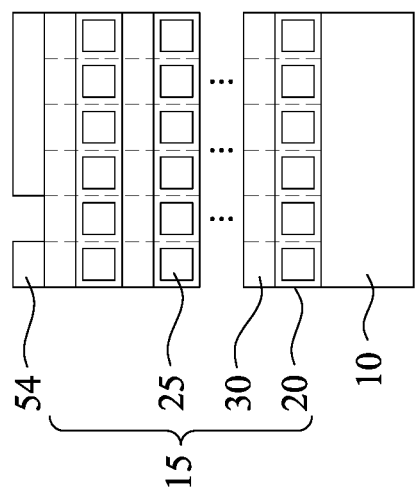
Figure 7C:
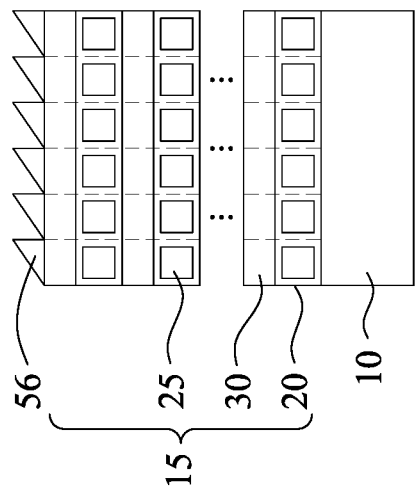

FIGS. 7A, 7B and 7C show various cross sectional views of EUV reflective structures according to embodiments of the disclosure. Material, configurations, dimensions, processes and/or methods as described with respect to the above embodiments may be employed in the following embodiments, and detailed explanation thereof may be omitted.

In the embodiments of FIGS. 7A-7C, one or more cap layers are disposed over the multilayer structure 15.

In some embodiments, as shown in FIG. 7A, the cap layer is a protective layer 52 made of a material that can prevent the multilayer stack 15 from oxidation. In some embodiments, the protective layer 52 is a silicon nitride layer or a polymer layer.

In some embodiments, as shown in FIG. 7B, the cap layer is an absorber layer 54 made of a material that can absorb the EUV light. In some embodiments, the absorber layer 54 is a TaBN layer. In some embodiments, the TaBN layer includes a circuit pattern, and thus the EUV reflective structure is used as an EUV photo mask.

In some embodiments, as shown in FIG. 7C, the cap layer is a grating layer 56 having a refractive structure. In some embodiments, the refractive structure 56 is made of silicon oxide, silicon nitride, Mo, Zr, Ti, Ta, W or any other suitable material.

Figure 8:
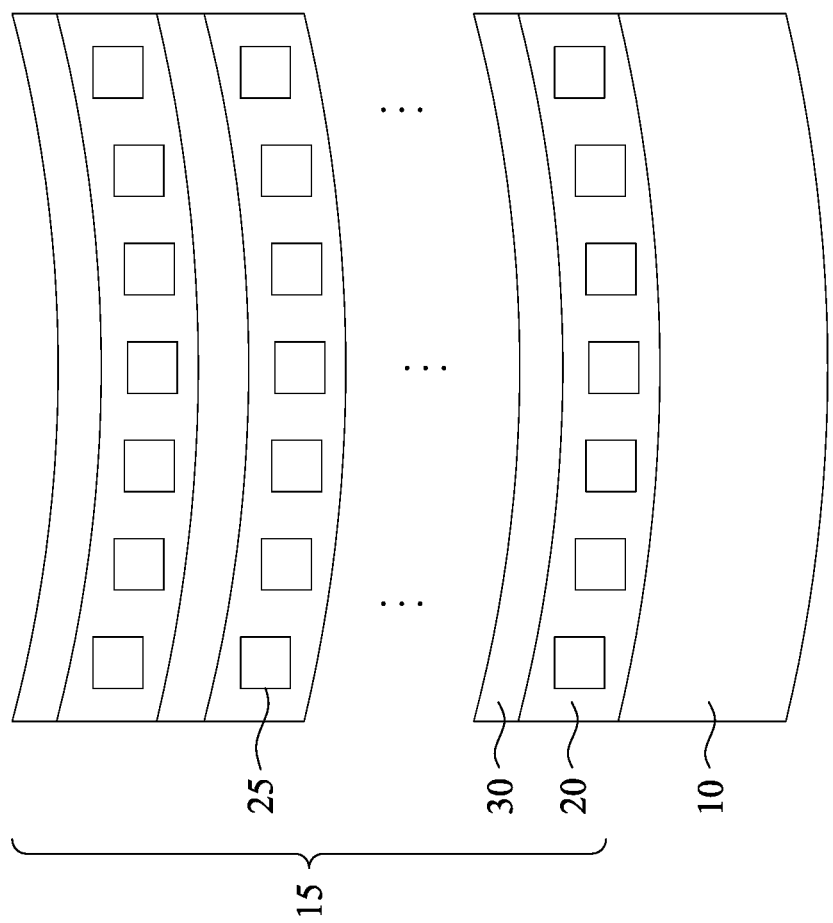
FIG. 8 is a cross sectional view of an EUV reflective mirror according to an embodiment of the disclosure.

FIG. 8 is a cross sectional view of an EUV reflective mirror according to an embodiment of the disclosure. Material, configurations, dimensions, processes and/or methods as described with respect to the above embodiments may be employed in the following embodiments, and detailed explanation thereof may be omitted As shown in FIG. 8, the substrate 10 has a curved surface having a desired curvature or reflective properties (focus position, etc) in at least the upper surface thereof. The Si/Mo multilayer structure 15 is formed on the curved surface.

Figure 9:
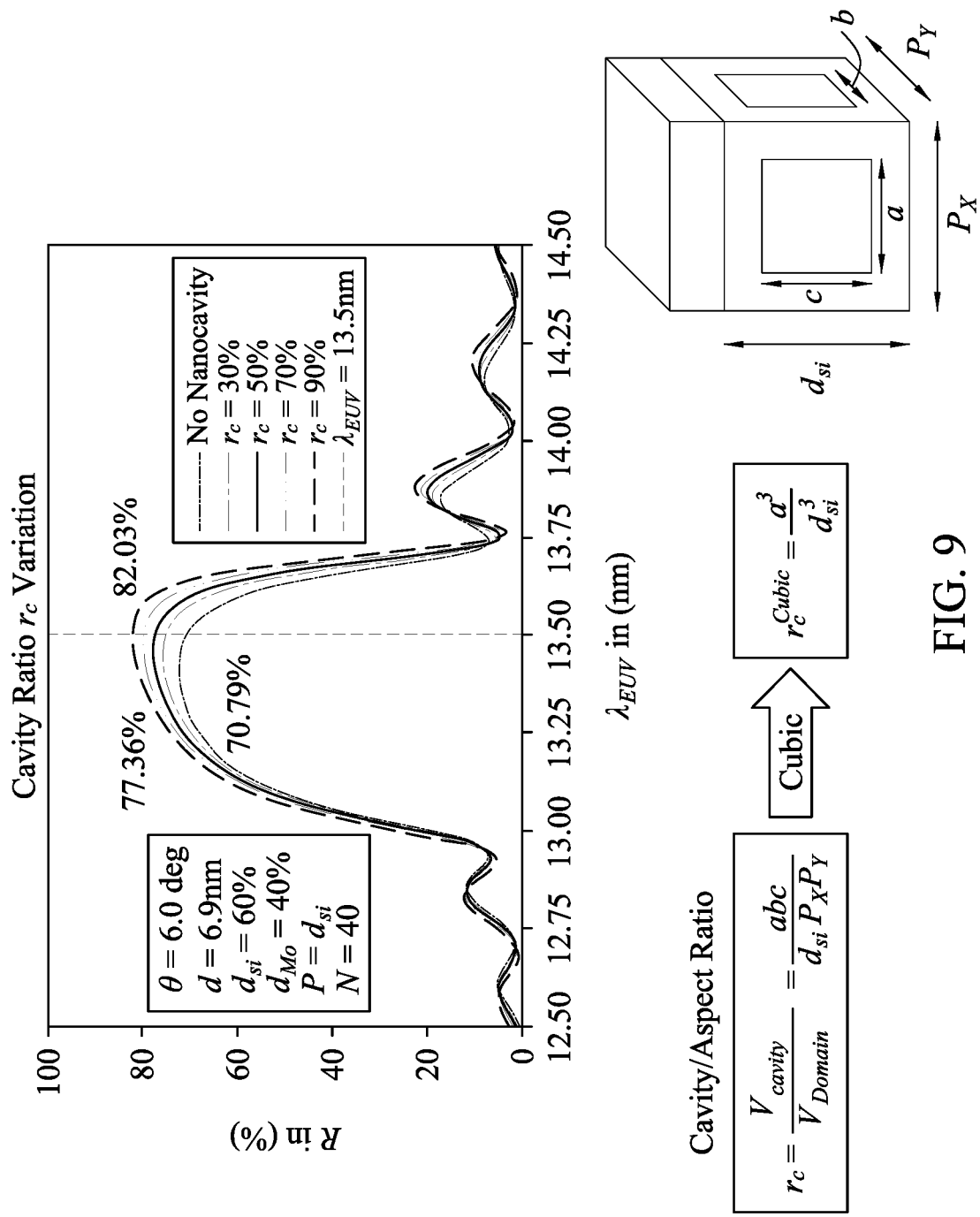
FIG. 9 shows simulation results of reflectivity for the EUV reflective structures according to embodiments of the disclosure.

FIG. 9 shows simulation results of reflectivity for the EUV reflective structures according to embodiments of the disclosure. The graph shows the EUV reflectivity with respect to the volume of the cavity in a unit structure. The unit structure has a dimension Px (a size in the X direction), Py (a size in the Y direction) and $d_{Si}$ the thickness of the Si layer). In some embodiments, Px and Py correspond to the pitches of the nano cavities 25 in both directions. Further, "a", "b and "c" are dimensions of the nano cavity. When the nano cavity and the unit structure are cubic, the volume of the nano cavity is $a^3$ and the volume of the unit structure is $d_{Si}^3$. In some embodiments, a, b and c are in a range from about 1 nm to about 50 nm, respectively, and are in a range from about 2 nm to about 10 nm.

As shown in FIG. 9, when no cavities are disposed, the EUV reflectivity of about 70% at 13.5 nm light. When nano cavities 25 are introduced, the EUV reflectivity is more than 73%. With the cavity aspect ratio (a ratio of the cavity volume to the volume of unit structure defined by the pitches and thickness of the Si layer) increases, the EUV reflectivity increases. In some embodiments, the EUV reflectivity is more than 80%, when the cavity aspect ratio is 0.7 (70%) or more. In some embodiments, the ratio is in a range from about 0.3 to 0.9. In certain embodiments, when the plurality of cavities are arranged in a matrix with a pitch p1 in one direction and a pitch p2 in another direction crossing the one direction, and the Si layer has a thickness t, a volume Vn of each of the plurality of cavities satisfies $0.3 \leq Vn/(t \times p1 \times p2) \leq 0.9$.

Figure 10:
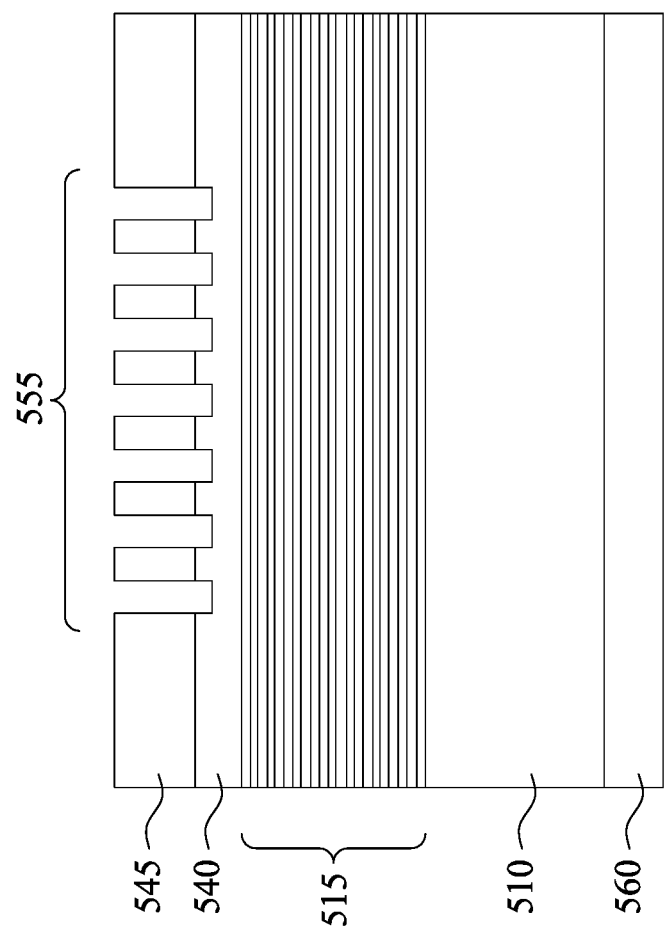
FIG. 10 shows an EUV photo mask according to an embodiment of the disclosure.

FIG. 10 shows an EUV photo mask according to an embodiment of the disclosure. In the present disclosure, the terms mask, photomask, and reticle are used interchangeably. In the present embodiment, the patterning optic shown in FIG. 10 is a reflective reticle. In an embodiment, the reflective reticle includes a substrate 510 formed of a suitable material, such as a low thermal expansion material or fused quartz, similar to the substrate 10. In various examples, the material of the substrate 510 includes $TiO_2$ doped $SiO_2$, or other suitable materials with low thermal expansion. The reflective reticle includes multiple reflective layers (ML) 515 according to the embodiments as set forth above. The reticle may further include a capping layer 540, such as ruthenium (Ru), disposed on the ML for protection. The mask further includes an absorption layer 545, such as a tantalum boron nitride (TaBN) layer, deposited over the ML 515. The absorption layer 545 is patterned to define a layer of an integrated circuit (IC). The reflective reticle includes a conductive backside coating 560. Alternatively, another reflective layer may be deposited over the ML 515 and is patterned to define a layer of an integrated circuit, thereby forming an EUV phase shift reticle.

FIGS. 11-19 shows views of various stages of a sequential manufacturing operation for an EUV reflective structure according to an embodiment of the present disclosure. It is understood that additional operations can be provided before, during, and after processes shown by FIGS. 11-19, and some of the operations described below can be replaced or eliminated, for additional embodiments of the method. The order of the operations/processes may be interchangeable. Materials, configuration, dimensions, processes and/or method explained with respect to the above embodiments can be applied to the following embodiments, and the detailed description thereof may be omitted.

As shown in FIG. 11, a Si layer 620 is formed over a substrate 610, for example a quartz substrate. Then, as shown in FIG. 12, a mask pattern 630 is formed over the Si layer 620. In some embodiments, the mask pattern 630 is a photo resist pattern. In other embodiments, the mask pattern 630 is a hard mask pattern made of, for example, silicon oxide and/or silicon nitride. As shown in FIG. 13, the Si layer 620 is then patterned by using the mask pattern 630 as an etching mask. In some embodiments, the patterned Si (Si patterns) 625 are Si pillars. In other embodiments, the patterned Si layer is a framed shaped.

Figure 19:
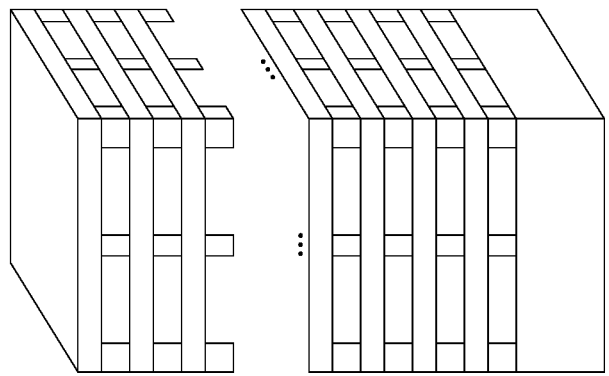
FIG. 19 shows a view of one of the various stages of a sequential manufacturing operation for an EUV reflective structure according to an embodiment of the present disclosure.
Figure 18:
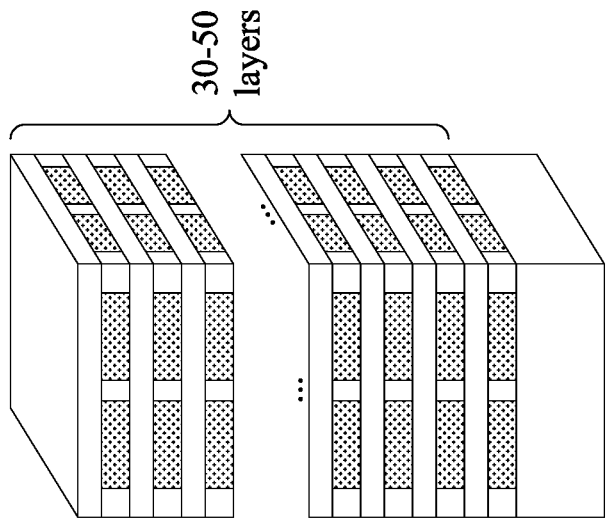
FIG. 18 shows a view of one of the various stages of a sequential manufacturing operation for an EUV reflective structure according to an embodiment of the present disclosure.
Figure 17:
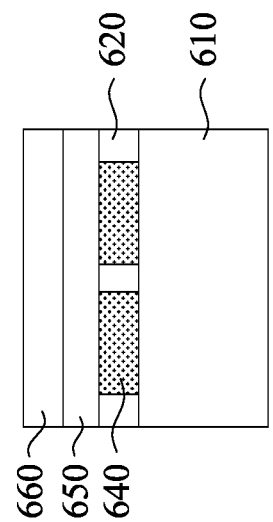
FIG. 17 shows a view of one of the various stages of a sequential manufacturing operation for an EUV reflective structure according to an embodiment of the present disclosure.

Next, as shown in FIG. 14, a sacrificial layer 640 is form over the Si patterns 625. In some embodiments, the sacrificial layer 640 includes one or more of silicon oxide, silicon nitride, SiON, SiOC, SiOCN or any other suitable material that can be selectively removed with respect to Si and Mo. The sacrificial layer 640 is formed by ALD or CVD in some embodiments. Then, as shown in FIG. 15, a planarization operation, such as CMP, is performed to expose the Si patterns 625. In some embodiments, the height of the Si patterns 625 is adjusted (reduced) by the CMP operation. A Mo layer 650 is then formed on the Si patterns 625 and the sacrificial layer 640 as shown in FIG. 16. The Mo layer 650 is formed by PVD, CVD or ALD in some embodiments. Further, an additional Si layer 660 is formed on the Mo layer 650 as shown in FIG. 17. The operations of forming a Si layer as shown in FIG. 15 to forming an additional Si layer as shown in FIG. 17 are repeated for about 30-50 times, and thus the structure as shown in FIG. 18 is obtained. Note that, repeats of this processes more than 50 times is also possible. Subsequently, the sacrificial layers 640 are removed by wet and/or dry etching operations and thus, the EUV reflective structure as shown in FIG. 19 is obtained.

In some embodiments, when the sacrificial layer is silicon oxide, a wet etching operation using HF or BHF can be used to selectively remove the sacrificial layer 640.

Figure 20B:
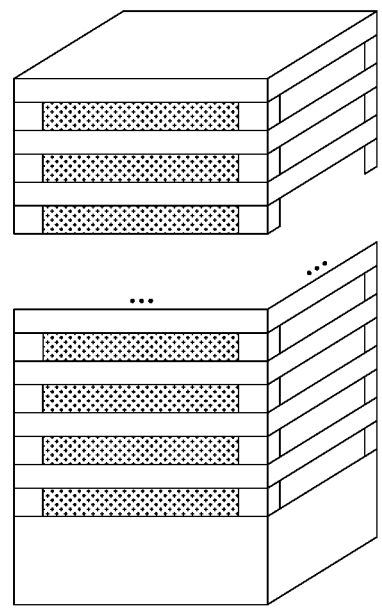
FIGS. 20A, 20B, 20C and 20D show views of the various stages of a sequential manufacturing operation for an EUV reflective structure according to an embodiment of the present disclosure.
Figure 20A:
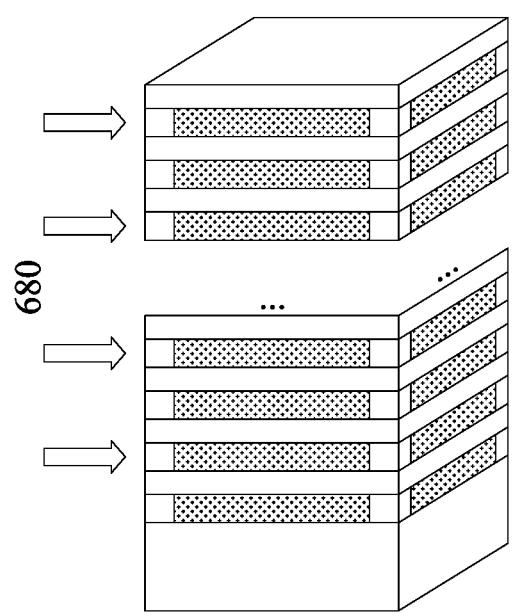
Figure 20D:
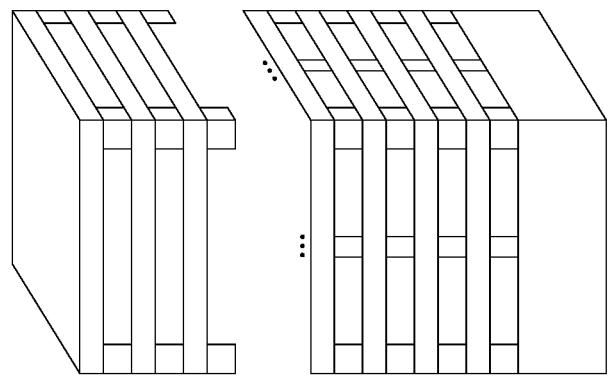
Figure 20C:
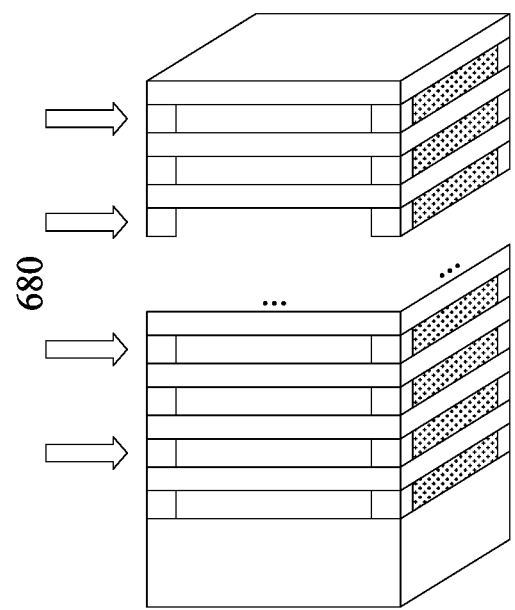

FIGS. 20A-20D show another operation to remove the sacrificial layer 640 according to an embodiment of the present disclosure. In some embodiments, the stacked structure shown in FIG. 18 is turned 90 degrees as shown in FIG. 20A. Then, an etching operation, such as a dry etching operation 680, is performed from one side of the stacked structure. Then, the stacked structure is rotated 90 degrees as shown in FIG. 20B, and then the etching operation 680 is performed from the next side of the stacked structure as shown in FIG. 20C. The etching operations are repeated to fully remove the sacrificial layer 640 as shown in FIG. 20D.

Figure 21:
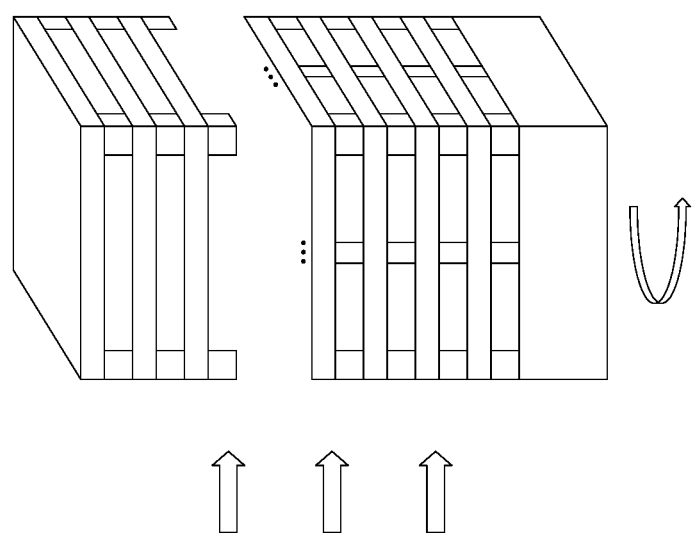
FIG. 21 shows a view of one of the various stages of a sequential manufacturing operation for an EUV reflective structure according to an embodiment of the present disclosure.

FIG. 21 shows another operation to remove the sacrificial layer 640 according to an embodiment of the present disclosure. In some embodiments, the stacked structure shown in FIG. 19 is placed on a rotating table and an etching operation is performed from the side of the rotating stacked structure as shown in FIG. 21.

Figure 22:
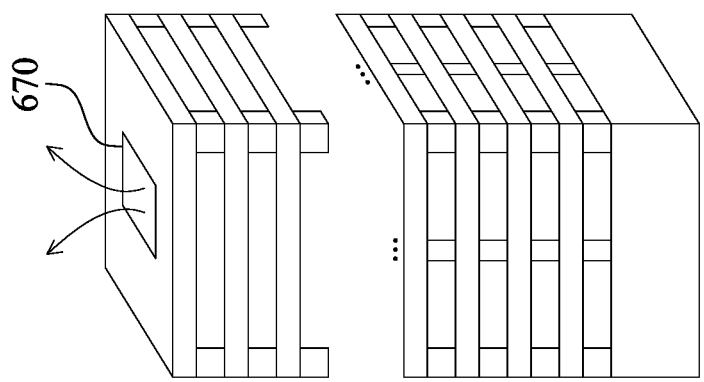
FIG. 22 shows a view of one of the various stages of a sequential manufacturing operation for an EUV reflective structure according to an embodiment of the present disclosure.

FIG. 22 shows another operation to remove the sacrificial layer 640 according to an embodiment of the present disclosure. In some embodiments, an outlet hole is formed on at least the uppermost Mo layer, to remove the etching residuals from inside to outside of the stacked structure as shown in FIG. 22.

FIGS. 23-26 shows views of various stages of a sequential manufacturing operation for an EUV reflective structure according to other embodiments of the present disclosure. Materials, configuration, dimensions, processes and/or method explained with respect to the above embodiments can be applied to the following embodiments, and the detailed description thereof may be omitted.

Figure 24:
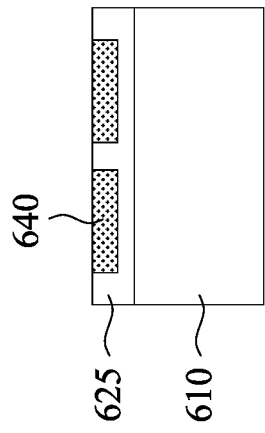
FIG. 24 shows a view of one of the various stages of a sequential manufacturing operation for an EUV reflective structure according to an embodiment of the present disclosure.
Figure 23:
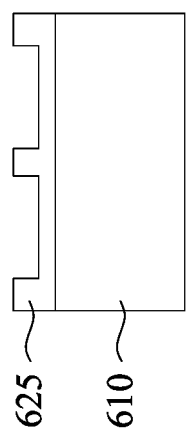
FIG. 23 shows a view of one of the various stages of a sequential manufacturing operation for an EUV reflective structure according to an embodiment of the present disclosure.
Figure 25:
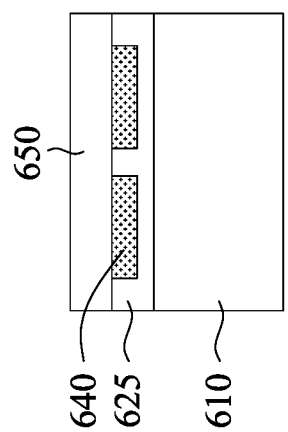
FIG. 25 shows a view of one of the various stages of a sequential manufacturing operation for an EUV reflective structure according to an embodiment of the present disclosure.

As shown in FIG. 23, when the Si layer 620 is patterned, the etching is stopped not to expose the surface of the substrate 610. Then, the sacrificial layer 640 is formed, and a CMP operation is performed as shown in FIG. 24. The Mo layer 650 is then formed on the Si pattern 625 and the sacrificial layer 640 as shown in FIG. 25.

Figure 26:
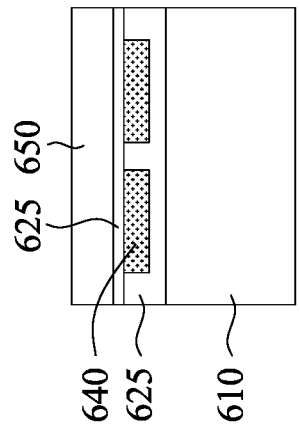
FIG. 26 shows a view of one of the various stages of a sequential manufacturing operation for an EUV reflective structure according to an embodiment of the present disclosure.

In other embodiments, as shown in FIG. 26, an additional Si layer 625 is formed before the Mo layer 650 is formed.

It will be understood that not all advantages have been necessarily discussed herein, no particular advantage is required for all embodiments or examples, and other embodiments or examples may offer different advantages.

In the present embodiments, the reflectivity of an EUV reflective structure can be enhanced by including nano cavities in the Si layers of the Si/Mo multiple reflective layer.

In accordance with one aspect of the present disclosure, an EUV reflective structure includes a substrate and multiple pairs of a Si layer and a Mo layer. The Si layer includes a plurality of cavities. In one or more of the foregoing or following embodiments, each of the plurality of cavities has a polygonal pillar shape. In one or more of the foregoing or following embodiments, each of the plurality of cavities has a cubic shape. In one or more of the foregoing or following embodiments, each of the plurality of cavities has a cylindrical pillar shape. In one or more of the foregoing or following embodiments, the plurality of cavities are arranged in a matrix in the Si layer. In one or more of the foregoing or following embodiments, the plurality of cavities are arranged in the matrix with constant pitches in two directions. In one or more of the foregoing or following embodiments, each of the plurality of cavities contains a gas. In one or more of the foregoing or following embodiments, each of the plurality of cavities is under an atmospheric pressure. In one or more of the foregoing or following embodiments, each of the plurality of cavities is filled with a dielectric material. In one or more of the foregoing or following embodiments, a thickness of each of the multiple pairs is in a range from 6.5 nm to 7.5 nm. In one or more of the foregoing or following embodiments, a thickness Ts of the Si layer and a thickness Tm of the Mo layer satisfy Ts:Tm=5:5 to 7:3. In one or more of the foregoing or following embodiments, no cavity is disposed in the Mo layer. In one or more of the foregoing or following embodiments, each of the plurality of cavities is fully embedded in the Si layer. In one or more of the foregoing or following embodiments, one face of each of the plurality of cavities is covered by the Mo layer. In one or more of the foregoing or following embodiments, each of the plurality of cavities has an area in plan view at least 1 nm$^2$. In one or more of the foregoing or following embodiments, the plurality of cavities have a same thickness as the Si layer. In one or more of the foregoing or following embodiments, the Si layer comprises a plurality of pillars. In one or more of the foregoing or following embodiments, the plurality of cavities are arranged in a matrix with a pitch p1 in one direction and a pitch p2 in another direction crossing the one direction, and the Si layer has a thickness t, and a volume Vn of each of the plurality of cavities satisfies $0.3 \leq Vn/(t \times p1 \times p2) \leq 0.9$. In one or more of the foregoing or following embodiments, each of the plurality of cavities has a volume in a range from 1 nm$^3$ to 1,000,000 nm$^3$. In one or more of the foregoing or following embodiments, a total number of the multiple pairs is at least 40. In one or more of the foregoing or following embodiments, the EUV reflective structure further includes a cap layer over the multiple pairs. In one or more of the foregoing or following embodiments, the cap layer includes a material that protects the multiple pairs from oxidation. In one or more of the foregoing or following embodiments, the cap layer includes an EUV absorber having a circuit pattern. In one or more of the foregoing or following embodiments, the cap layer includes a diffractive grating. In one or more of the foregoing or following embodiments, the EUV reflector has a curved shape forming a collector mirror.

In accordance with another aspect of the present disclosure, an EUV collector mirror includes a substrate having a curved upper surface and multiple pairs of a Si layer and a Mo layer disposed over the curved upper surface. The Si layer includes a plurality of cavities.

In accordance with another aspect of the present disclosure, an EUV photo mask includes a substrate, a multilayer structure disposed over the substrate, the multilayer structure including multiple pairs of a Si layer and a Mo layer, and an absorption layer disposed over the multilayer structure. The Si layer includes a plurality of cavities.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) reflective structure, comprising:
   a substrate;
   a multilayer structure including multiple pairs of a Si layer and a Mo layer; and
   a cap layer disposed over the multilayer structure
   wherein the Si layer includes a plurality of cavities.

2. The EUV reflective structure of claim 1, wherein each of the plurality of cavities has one or more of a polygonal pillar shape, a cubic shape, or a cylindrical pillar shape.

3. The EUV reflective structure of claim 1, wherein the plurality of cavities are arranged in a matrix in the Si layer.

4. The EUV reflective structure of claim 3, wherein the plurality of cavities are arranged in the matrix with constant pitches in two directions.

5. The EUV reflective structure of claim 1, wherein the cap layer is made of a silicon nitride or a polymer.

6. The EUV reflective structure of claim 1, wherein each of the plurality of cavities is filled with a dielectric material.

7. The EUV reflective structure of claim 1, wherein a thickness of each of the multiple pairs is in a range from 6.5 nm to 7.5 nm.

8. The EUV reflective structure of claim 7, wherein a thickness Ts of the Si layer and a thickness Tm of the Mo layer satisfy Ts:Tm=5:5 to 7:3.

9. The EUV reflective structure of claim 1, wherein no cavity is disposed in the Mo layer.

10. The EUV reflective structure of claim 1, wherein each of the plurality of cavities is fully embedded in the Si layer.

11. The EUV reflective structure of claim 1, wherein one face of each of the plurality of cavities is covered by the Mo layer.

12. The EUV reflective structure of claim 1, wherein each of the plurality of cavities has an area in plan view at least 1 nm$^2$.

13. The EUV reflective structure of claim 1, wherein the plurality of cavities have a same thickness as the Si layer.

14. The EUV reflective structure of claim 1, wherein the Si layer comprises a plurality of pillars.

15. An EUV reflective structure, comprising:
    a substrate; and
    a multilayer structure including multiple pairs of a Si layer and a Mo layer; and
    a refractive grating layer disposed over the multilayer structure
    wherein the Si layer includes a plurality of cavities.

16. The EUV reflective structure of claim 15, wherein the refractive grating layer is made of silicon oxide or silicon nitride.

17. The EUV reflective structure of claim 15, wherein the refractive grating layer is made of Mo, Zr, Ti, Ta or W.

18. An EUV reflective structure comprising:
    a substrate;
    a multilayer structure disposed over the substrate, the multilayer structure including multiple pairs of a Si layer and a Mo layer; and
    an absorption layer disposed over the multilayer structure and having circuit patterns,
    wherein the multilayer structure includes a plurality of cavities.

19. The EUV reflective structure of claim 18, wherein the plurality of cavities are arranged in a matrix with constant pitches in two directions.

20. The EUV reflective structure of claim 18, wherein the absorption layer includes TaBN.

* * * * *